(12) United States Patent
Matsuda et al.

(10) Patent No.: US 7,468,636 B2
(45) Date of Patent: Dec. 23, 2008

(54) RADIO FREQUENCY POWER AMPLIFIER

(75) Inventors: Shingo Matsuda, Kyoto (JP); Kazuki Tateoka, Kyoto (JP); Hirokazu Makihara, Osaka (JP)

(73) Assignee: Panasonic Corporation, Osaka (JP)

( * ) Notice: Subject to any disclaimer, the term of this patent is extended or adjusted under 35 U.S.C. 154(b) by 56 days.

(21) Appl. No.: 11/640,866

(22) Filed: Dec. 19, 2006

(65) Prior Publication Data

US 2007/0146077 A1     Jun. 28, 2007

(30) Foreign Application Priority Data

Dec. 22, 2005   (JP) .............................. 2005-369503

(51) Int. Cl.
*H03F 3/191* (2006.01)
(52) U.S. Cl. ...................... 330/302; 330/310
(58) Field of Classification Search ................. 330/302, 330/306, 310
See application file for complete search history.

(56) References Cited

U.S. PATENT DOCUMENTS 4,760,348 A * 7/1988 Pease et al. ................. 330/151
5,818,880 A * 10/1998 Kriz et al. .................... 375/306
2002/0118067 A1 * 8/2002 Hirayama ..................... 330/302

FOREIGN PATENT DOCUMENTS

JP           8-37433 A      2/1996

OTHER PUBLICATIONS

Akira Inoue, et al., "Analysis of Class-F and Inverse Class-F Amplifiers," Technical Report of IEICE, 2001, pp. 29-35, IEICE.
Akira Inoue, et al., "The Efficiency of Class-F and Inverse Class-F Amplifiers," IEICE Electronic Society, 2004, pp. 61.

* cited by examiner

*Primary Examiner*—Steven J Mottola
(74) *Attorney, Agent, or Firm*—McDermott Will & Emery LLP (57) ABSTRACT

A radio frequency power amplifier 1 includes a former-stage transistor 2, a latter-stage transistor 3, and an inter-stage matching circuit 4 for connecting the former-stage transistor 2 and the latter-stage transistor 3. The inter-stage matching circuit 4 includes a high-pass filter circuit including a transfer line m1, a capacitor C1 and a capacitor C2; and a transfer line m2 with which a passage phase of a secondary harmonic signal is 15 degrees or greater.

1 Claim, 14 Drawing Sheets

RADIO FREQUENCY POWER AMPLIFIER

BACKGROUND OF THE INVENTION

1. Field of the Invention

The present invention relates to a radio frequency power amplifier suitable for power amplification of a radio frequency signal, which includes a plurality of stages of transistors.

2. Description of the Background Art

A radio frequency power amplifier used for wireless communication is desired to be designed to have a low distortion and a high efficiency. In many communication systems, a quadrature modulation system is used to improve the communication speed, and a communication signal is processed with amplitude modulation in addition to phase modulation in order to suppress frequency dispersion of the modulated signal. Therefore, as a radio frequency power amplifier, a linear amplifier capable of reproducing the amplitude modulation performed on an input signal with high fidelity is used.

In the GMSK (Gaussian filtered Minimum Shift Keying) modulation used for GSM (Global System for Mobile Communications), a modulated signal is formed by a phase change between two values, i.e., a positive value and a negative value, and so has no amplitude component. Therefore, a radio frequency power amplifier used for the GSM system does not need to reproduce power amplification. As such a radio frequency power amplifier, either a linear or a non-linear amplifier is usable. In general, a non-linear amplifier capable of providing a high efficiency is used. In this manner, different types of radio frequency power amplifiers are used for wireless communication in accordance with the modulation system used.

As is well known, the efficiency of a radio frequency power amplifier can be improved by increasing the gain compression amount, and can be further improved by matching the harmonic frequency. However, the optimum condition for improving the efficiency effectively varies depending on the control method of an output power of the radio frequency power amplifier or on whether the radio frequency power amplifier is a linear amplifier or a non-linear amplifier.

For example, non-patent document 1 (Inoue, et al., "Analysis of Class-F and Inverse Class-F Amplifiers", Technical Report of IEICE, ED2000-231, MW2000-180, ICD2000-191 (2001-01)) reports that the efficiency at the time of high gain compression is higher in an inverse class-F amplifier, in which the second harmonic is open and the third harmonic is shortcircuited, than in a class-F amplifier, in which the second harmonic is shortcircuited and the third harmonic is open. Non-patent document 2 ("The Efficiency of Class-F and Inverse Class-F Amplifiers", IEICE Electronic Society (C-10-13) 2004) reports that the efficiency at the time of 1 dB gain compression is higher in an inverse class-F amplifier than in a class-F amplifier when the magnitude of the idle current is large, and is higher in a class-F amplifier than in an inverse class-F amplifier when the magnitude of the idle current is small. In this manner, with radio frequency power amplifiers, the efficiency can be improved by optimally adjusting the matching condition for harmonics in accordance with the communication system.

In the GSM system, a highly efficient non-linear radio frequency power amplifier is used, and two methods are used for controlling the output power thereof. According to a first method, the base voltage of the transistor is controlled to vary the power gain and thus to adjust the output power. According to a second method, the collector voltage of the transistor is controlled to vary the power gain and thus to adjust the output power.

According to the first method, the output power is logarithmically varied with respect to the base voltage. Therefore, the sensitivity of the output power with respect to the base voltage is increased, which makes it difficult to control the output power. According to the second method, the output power is varied in a linear function manner with respect to the collector voltage. Therefore, it is easy to control the output power.

Figure 9:
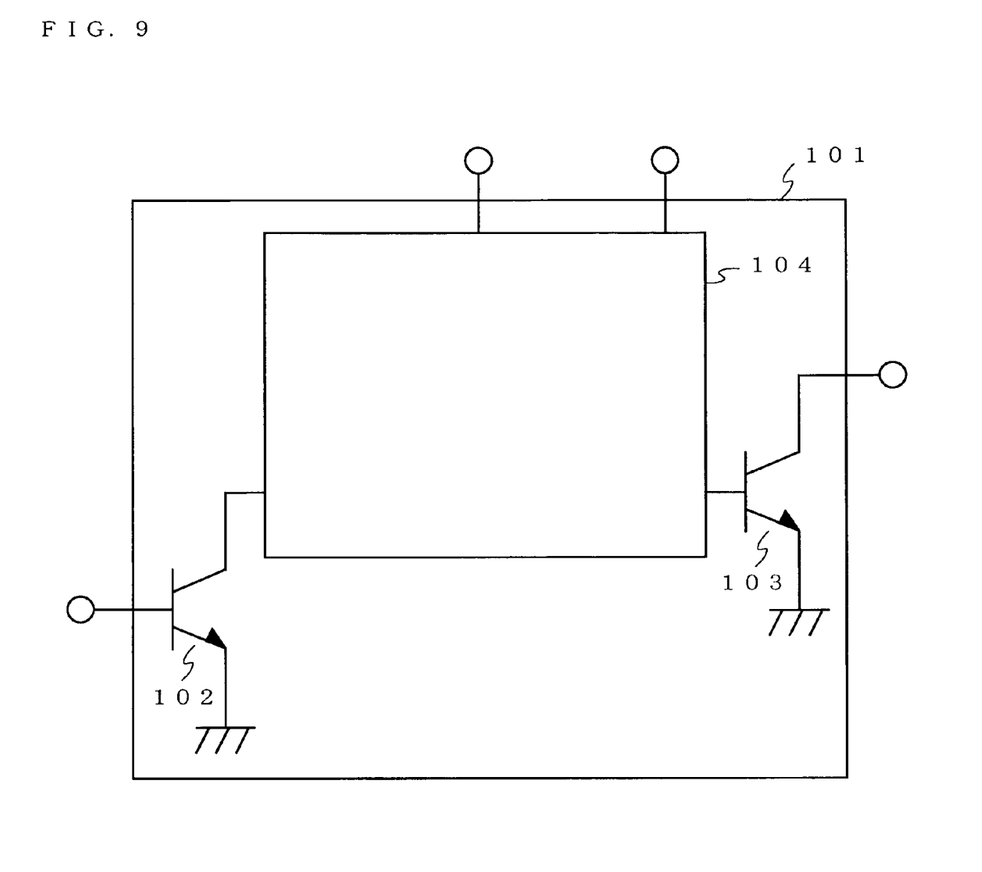
FIG. 9 shows an exemplary basic circuit configuration of a radio frequency power amplifier 101.

FIG. 9 shows an exemplary basic circuit configuration of a radio frequency power amplifier 101 using the second method.

The radio frequency power amplifier 101 includes two transistors 102 and 103 connected in a plurality of stages in order to increase the power gain. Usually, the latter-stage transistor 103, which amplifies a higher level of power, has a larger size. Therefore, the latter-stage transistor 103 has a larger parasitic capacitance or the like than the former-stage transistor 102, and has a lower impedance than the former-stage transistor 102. For these reasons, when a plurality of transistors are connected in a plurality of stages, an inter-stage matching circuit 104 is provided in order to match the impedance between the collector of the former-stage transistor 102 and the base of the latter-stage transistor 103.

Figure 10:
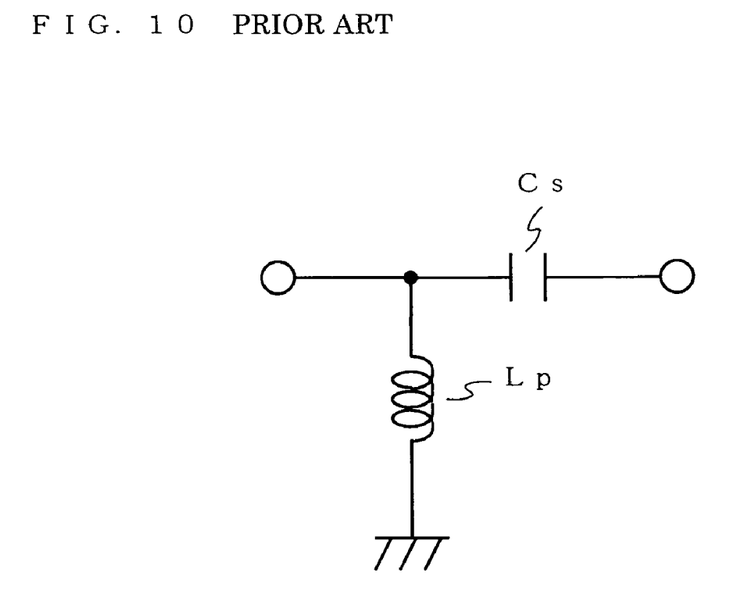
FIG. 10 shows an exemplary configuration of a high-pass filter type inter-stage matching circuit 104.
Figure 11:
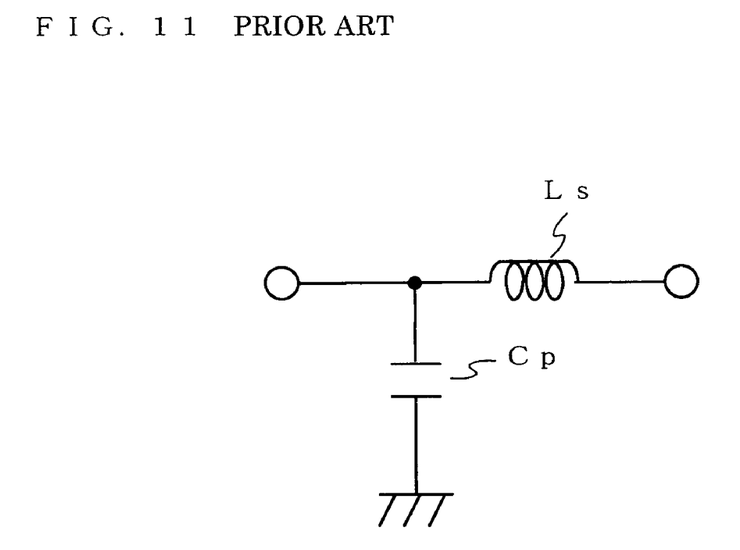
FIG. 11 shows an exemplary configuration of a low-pass filter type inter-stage matching circuit 104.

As a configuration of the inter-stage matching circuit 104, either a high-pass filter type shown in FIG. 10 which includes a grounded inductor Lp and a capacitor Cs connected thereto in series, or a low-pass filter type shown in FIG. 11 which includes a grounded capacitor Cp and an inductor Ls connected thereto in series, is used. In addition to matching the impedance, the inter-stage matching circuit 104 needs to supply a bias to the collector of the former-stage transistor 102 and to the base of the latter-stage transistor 103, and also needs to separate the DC components of these bias voltages.

Therefore, when using a low-pass filter type configuration, the inter-stage matching circuit 104 needs to additionally include an impedance conversion device such as a transmission line for supplying a bias, a inductor or the like in order to separate a radio frequency signal and a DC power supply for driving the transistors from each other. The inter-stage matching circuit 104 also needs to have a capacitor connected in series in order to separate the collector of the former-stage transistor 102 and the base of the latter-stage transistor 103 from each other. As a result, the circuit scale is enlarged.

Figure 12:
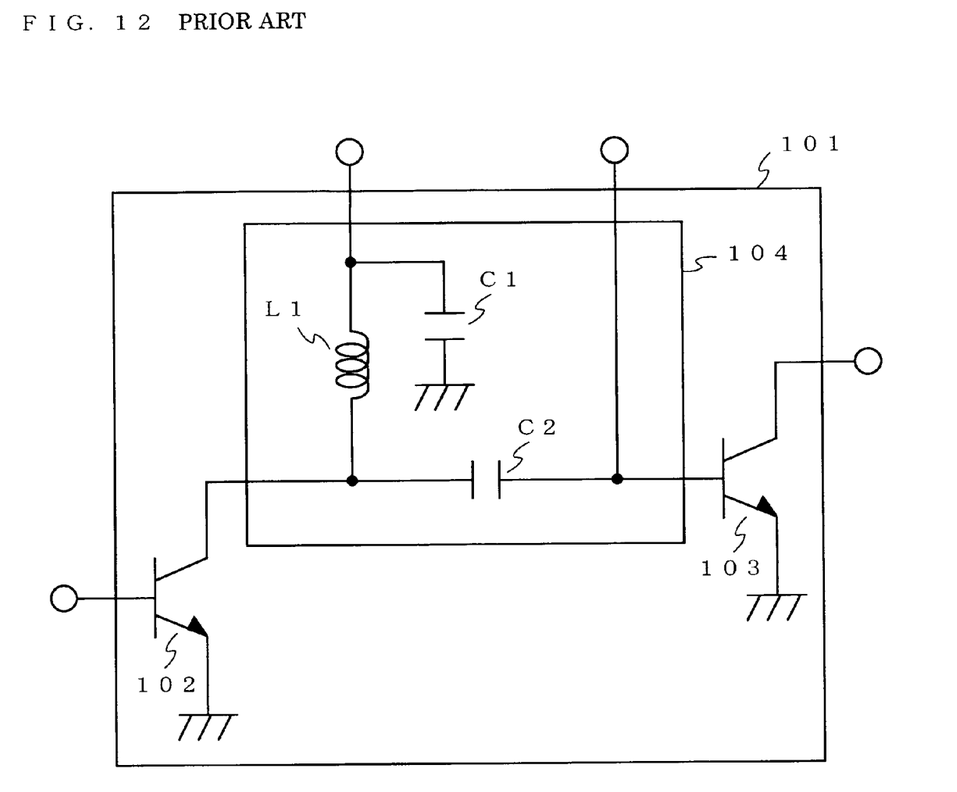
FIG. 12 shows an exemplary configuration of the conventional radio frequency power amplifier 101 using the high-pass filter type inter-stage matching circuit 104.

When using a high-pass filter type configuration, the inter-stage matching circuit 104 can supply a bias by grounding the inductor Lp via the capacitor, and separate the bias voltages by the capacitor Cs connected in series. Therefore, the impedance conversion device is not necessary, which allows the circuit to be designed to be compact. For this reason, a high-pass filter type configuration is usually preferred. FIG. 12 shows an exemplary conventional radio frequency power amplifier 101 using the high-pass filter type inter-stage matching circuit 104. In FIG. 12, an inductor L1 (=Lp) is grounded via a capacitor C1, and a capacitor C2 (=Cs) separates the collector of the former-stage transistor 102 and the base of the latter-stage transistor 103 from each other in a DC manner.

However, the inter-stage matching circuit 104 having the high-pass filter type configuration has a characteristic of passing most of the harmonic signal due to a small reflection therein of the harmonic signal. Hence, the impedance matching of the harmonic signal is not performed by the inter-stage matching circuit 104. The harmonic load impedance characteristic of the former-stage transistor 102 becomes equal to the harmonic load impedance characteristic of the latter-stage transistor 103. As a result, the impedance of the harmonic signal is of the low level as the impedance of the latter-stage transistor 103, and the impedance of the fundamental signal is of the high level as the impedance of the former-stage transistor 102.

Figure 13:
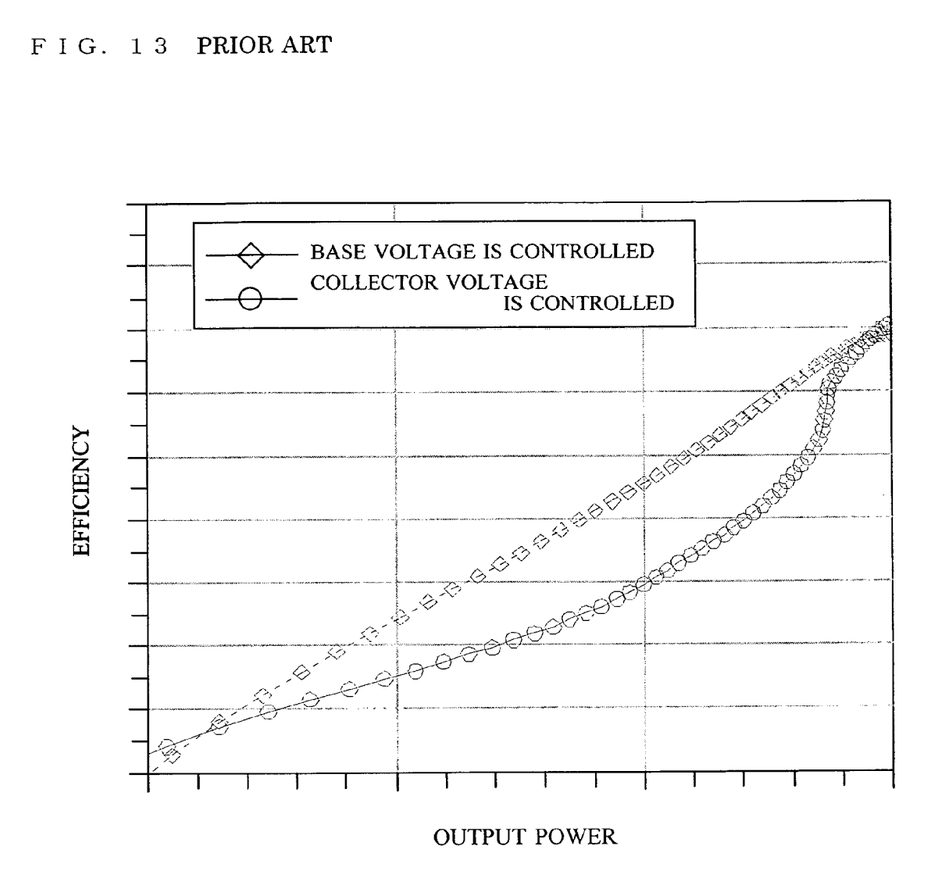
FIG. 13 shows exemplary output power vs. efficiency characteristics of the former-stage transistor 102 in the conventional radio frequency power amplifier 101.

FIG. 13 shows the output power vs. efficiency characteristics of the former-stage transistor 102 in the conventional radio frequency power amplifier 101 using the high-pass filter type inter-stage matching circuit 104. The dashed line represents the relationship between the output power and the efficiency when the base voltage is controlled. The solid line represents the relationship between the output power and the efficiency when the collector voltage is controlled. As shown in FIG. 13, the efficiency is gradually reduced when the base voltage is controlled. When the collector voltage is controlled, there is a region in which the efficiency is rapidly reduced. The cause of this phenomenon will be described with reference to FIG. 14 and FIG. 15.

Figure 14:
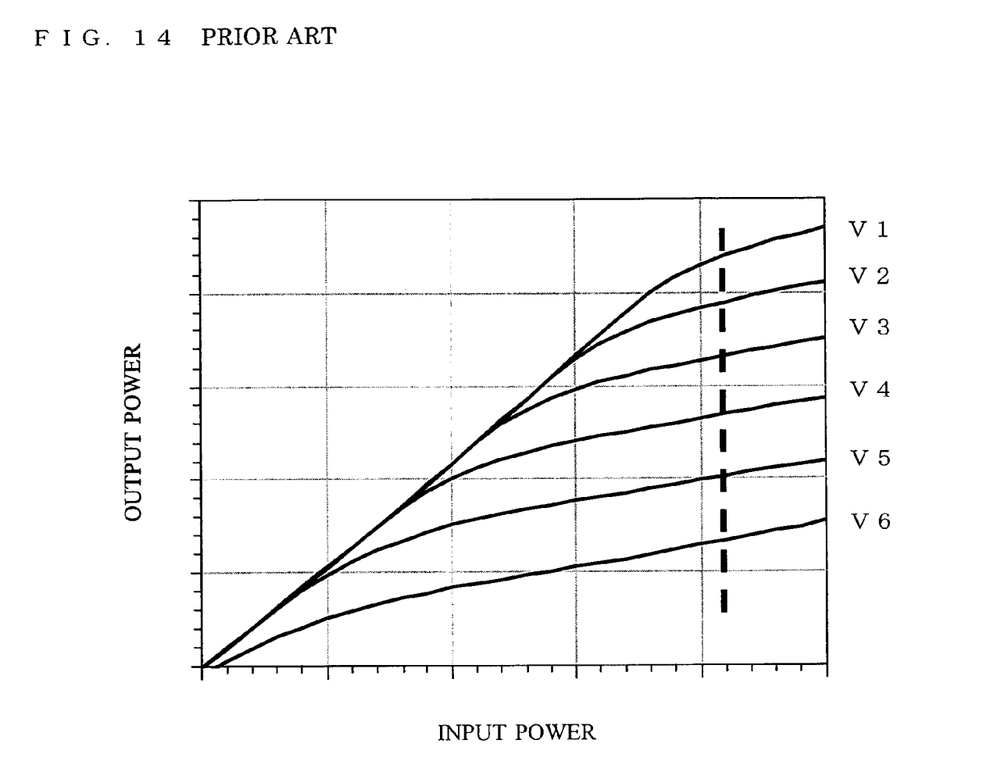
FIG. 14 shows exemplary input power vs. output power characteristics of the former-stage transistor 102 in the conventional radio frequency power amplifier 101.

FIG. 14 shows the input power vs. output power characteristics of the conventional radio frequency power amplifier 101 using the high-pass filter type inter-stage matching circuit 104. In FIG. 14, the horizontal axis represents the input power, and the vertical axis represents the output power. A plurality of characteristic lines V1 through V6 respectively represent the input vs. output characteristics, which are the characteristics of the output power with respect to the input power to the radio frequency power amplifier, at a plurality of collector voltages. The characteristic line V1 represents the characteristic at the highest collector voltage, and the collector voltage is gradually reduced in the order of the characteristic line V2, V3, V4, V5 and V6. With the method of controlling the collector voltage, the input power of a transmission signal which is input to the radio frequency power amplifier 101 is constant. The output power is adjusted along the dashed line by adjusting the collector voltage. It is confirmed that the input vs. output characteristics are in an excessive gain compressed state in a region where the collector voltage is low.

Figure 15:
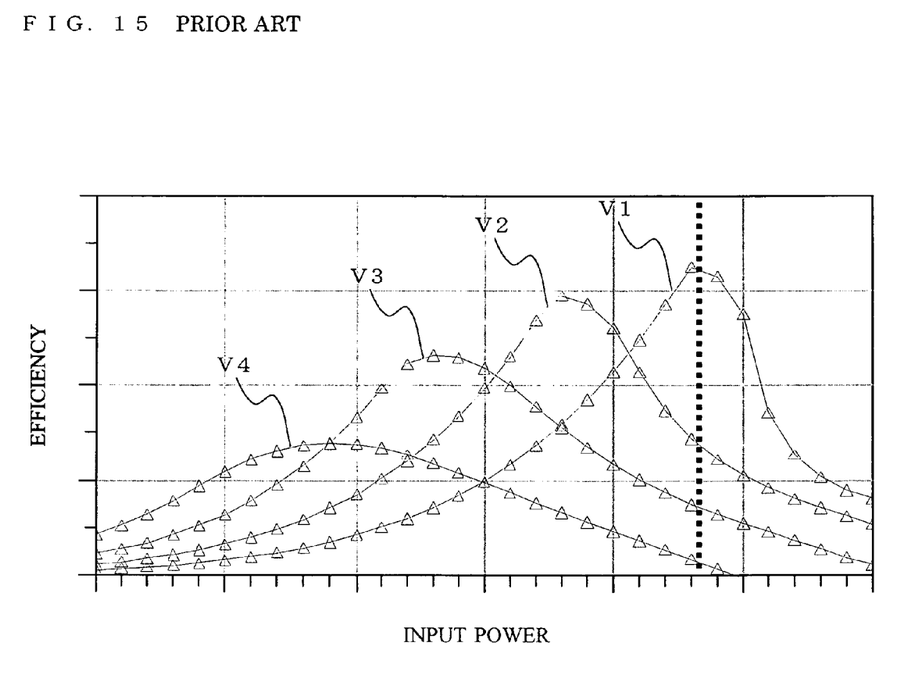
FIG. 15 shows exemplary input power vs. efficiency characteristics of the former-stage transistor 102 in the conventional radio frequency power amplifier 101.

FIG. 15 shows the input power vs. efficiency characteristics of the former-stage transistor 102 in the conventional radio frequency power amplifier 101 using the high-pass filter type inter-stage matching circuit 104. In FIG. 15, the horizontal axis represents the input power, and the vertical axis represents the efficiency of the former-stage transistor 102. A plurality of characteristic lines V1 through V4 respectively represents the efficiencies with respect to the input power at a plurality of collector voltages. The characteristic line V1 represents the efficiency at the highest collector voltage, and the collector voltage is gradually reduced in the order of the characteristic line V2, V3 and V4.

It is confirmed by FIG. 15 that as the input power is increased, the efficiency is rapidly reduced due to the excessive gain compressed state of the input vs. output characteristics shown in FIG. 14. In the case where such a characteristic is exhibited, when the collector voltage is controlled while the input power is fixed to the value of the dashed line, the efficiency is rapidly reduced as shown in FIG. 13.

SUMMARY OF THE INVENTION

Therefore, an object of the present invention is to provide a radio frequency power amplifier capable of adjusting the output power while suppressing the reduction in the efficiency with a system of controlling the collector voltage.

The present invention is directed to a radio frequency power amplifier including transistors for performing non-linear amplification connected in a plurality of stages. In order to attain the above-described object, the radio frequency power amplifier comprises a former-stage transistor including a base to which a signal is input; a latter-stage transistor including a collector from which the signal is output; and an inter-stage matching circuit for connecting a collector of the former-stage transistor and a base of the latter-stage transistor. The inter-stage matching circuit includes a high-pass filter circuit; and an impedance conversion device with which a phase shift of a second harmonic signal is 15 degrees or greater.

Typically, as the impedance conversion device, a transmission line, an inductor, or a circuit including an inductor and a capacitor connected in parallel, is used.

According to the present invention, the reduction in the power load efficiency of a non-linear transistor for controlling a collector voltage thereof and thus adjusting the output voltage can be suppressed.

These and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described with reference to the drawings.

Figure 1:
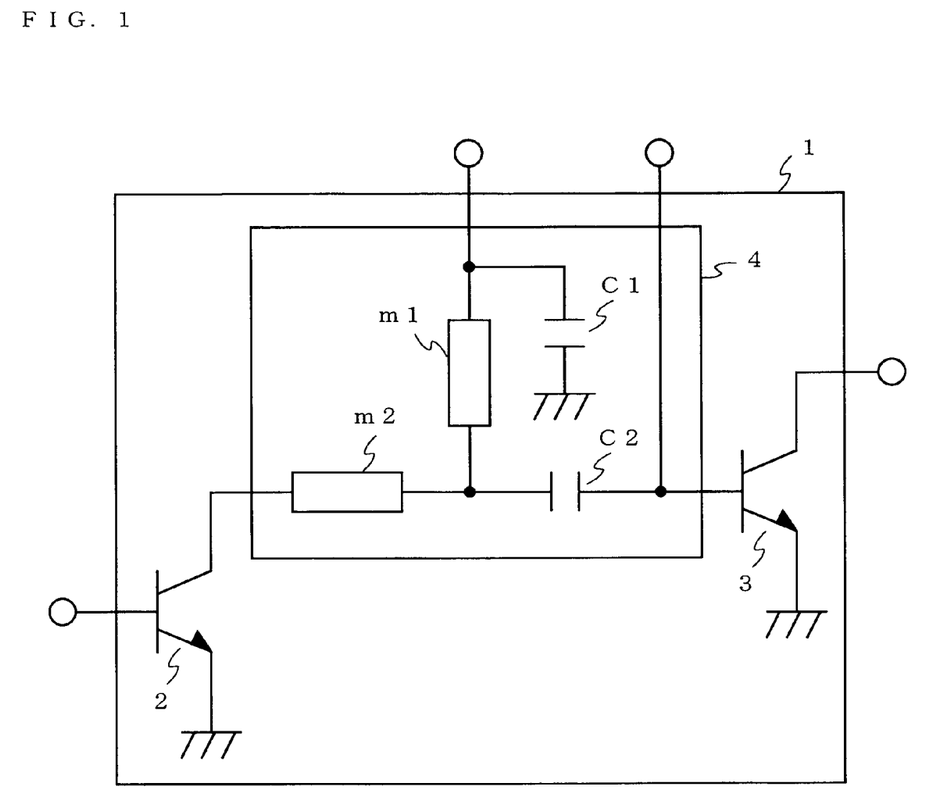
FIG. 1 shows a schematic configuration of a radio frequency power amplifier 1 according to one embodiment of the present invention.

FIG. 1 shows a schematic configuration of a radio frequency power amplifier 1 according to one embodiment of the present invention. As shown in FIG. 1, the radio frequency power amplifier 1 in this embodiment includes a former-stage transistor 2, a latter-stage transistor 3, and an inter-stage matching circuit 4 for connecting the former-stage transistor 2 and the latter-stage transistor 3. The inter-stage matching circuit 4 is a high-pass filter type circuit, and includes transmission lines m1 and m2, and capacitors C1 and C2.

In the former-stage transistor 2, a radio frequency signal is input to a base, and an amplified radio frequency signal is output from a collector. An emitter of the former-stage transistor 2 is grounded. The post-amplification radio frequency signal which is output from the collector of the former-stage transistor 2 is input to a base of the latter-stage transistor 3 via the transmission line m2 and the capacitor C2. A connection point of the transmission line m2 and the capacitor C2 is supplied with a collector bias via the transmission line m1. One terminal of the transmission line m1 which is supplied with the collector bias is grounded via the capacitor C1. The base of the latter-stage transistor 3 is supplied with a base bias. The latter-stage transistor 3 further amplifies the post-amplification radio frequency signal which is input to the base thereof, and then outputs the resultant signal from a collector thereof. An emitter of the latter-stage transistor 3 is grounded.

A feature of the present invention is that the transmission line m2 for adjusting the harmonic impedance is provided in the inter-stage matching circuit 4 in order to suppress the reduction in the amplification efficiency. The transmission line m2 has a function of controlling the reflection and passage of a second harmonic signal in the inter-stage matching circuit 4, and is preferably formed to have a line length with which the phase shift of the second harmonic signal is 15 degrees or greater.

The effects offered by providing the transmission line m2 will be described with reference to FIG. 2 through FIG. 4.

Figure 2:
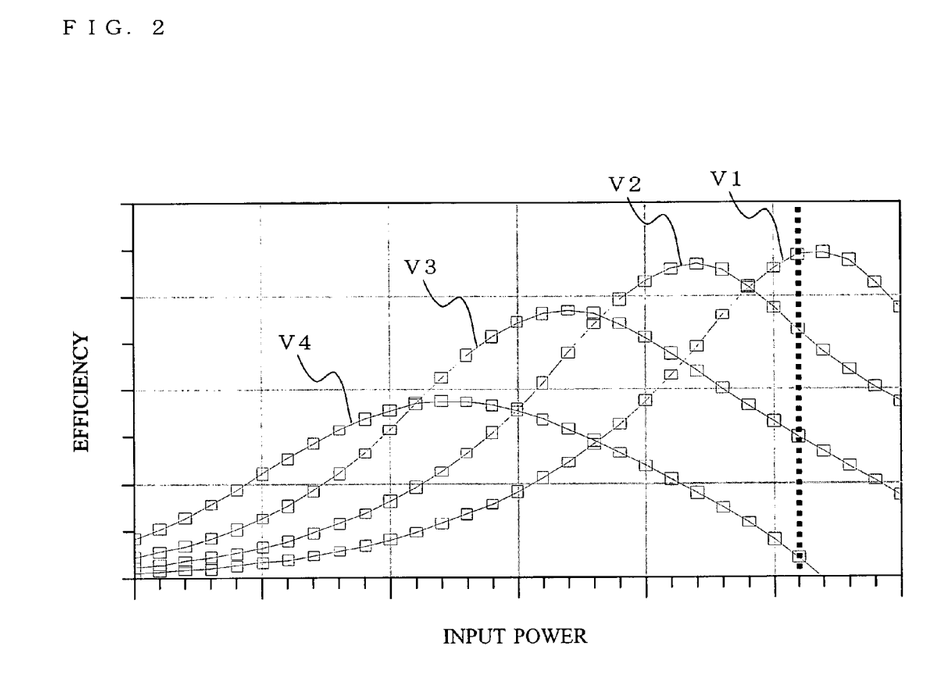
FIG. 2 shows the input power vs. efficiency characteristics of a former-stage transistor 2 in the radio frequency power amplifier 1.

FIG. 2 shows input power vs. efficiency characteristics of the former-stage transistor 2 in the radio frequency power amplifier 1 when a transmission line m2 with which the phase is 20 degrees is provided in the inter-stage matching circuit 4. In FIG. 2, the horizontal axis represents the input power to the former-stage transistor 2, and the vertical axis represents the efficiency of the former-stage transistor 2. A plurality of characteristic lines V1 through V4 respectively represent the efficiencies with respect to the input power to the radio frequency power amplifier 1 at a plurality of collector voltages. The characteristic line V1 represents the efficiency at the highest collector voltage, and the collector voltage is gradually reduced in the order of the characteristic line V2, V3 and V4.

Even in the case where the transmission line m2 is provided, the efficiency is reduced as the input power is increased, but the reduction in the efficiency is milder than in the conventional case (FIG. 15).

Figure 3:
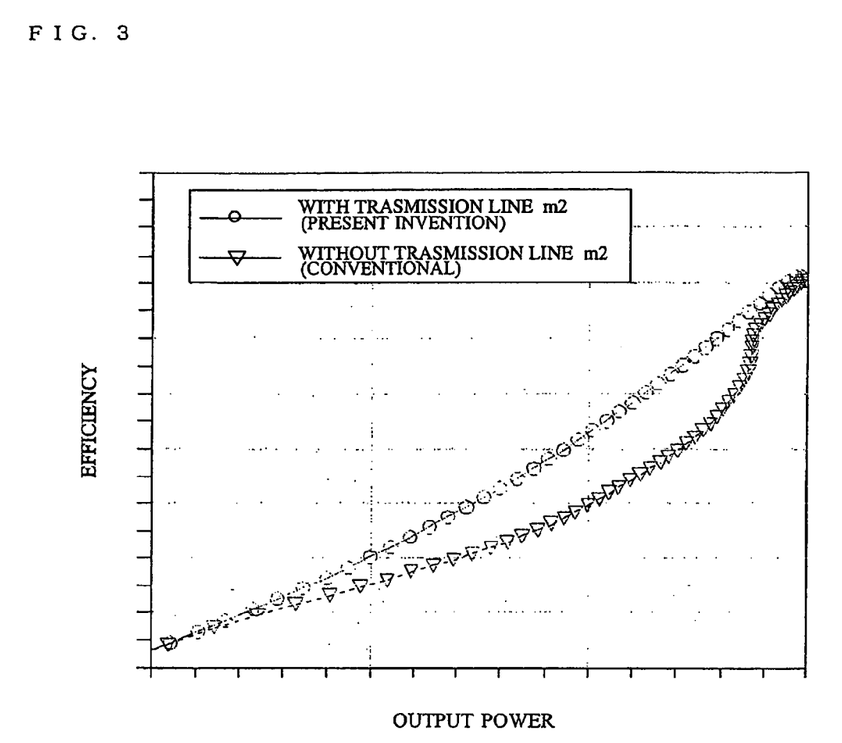
FIG. 3 shows the output power vs. efficiency characteristics of the former-stage transistor 2 in the radio frequency power amplifier 1.

FIG. 3 shows the output power vs. efficiency characteristics of the former-stage transistor 2 in the radio frequency power amplifier 1 when the transmission line m2 with which the phase shift is 20 degrees is provided in the inter-stage matching circuit 4. In FIG. 3, the dashed line represents the relationship between the output power and the efficiency of the former-stage transistor 2 when the conventional inter-stage matching circuit 104 (FIG. 12) with no transmission line m2 is used (same as the solid line in FIG. 13). The solid line represents the relationship between the output power and the efficiency of the former-stage transistor 2 when the inter-stage matching circuit 4 according to the present invention with the transmission line m2 is used. The input power is fixed.

As shown here, when the transmission line m2 is provided, the efficiency is improved as compared to the conventional case, and there is no region in which the efficiency is rapidly reduced.

Figure 4:
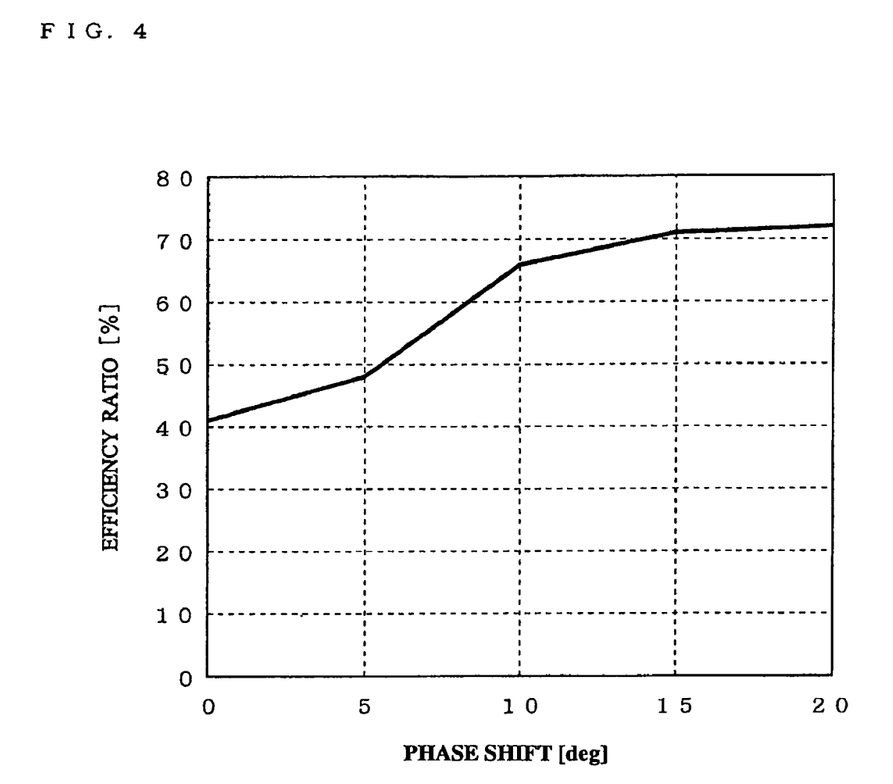
FIG. 4 shows the relationship between the phase shift of a transmission line m2 and the reduction in the efficiency.

FIG. 4 shows the relationship between the phase shift of the transmission line m2 and the reduction in the efficiency. In FIG. 4, the horizontal axis represents the phase shift of the second harmonic signal of the transmission line m2, and the vertical axis represents the ratio between the efficiency at the maximum voltage applied to the collector of the former-stage transistor 2 and the efficiency at half of the maximum voltage applied to the collector of the former-stage transistor 2.

As shown here, as the phase shift of the second signal is increased, the reduction in the efficiency is suppressed. When the phase shift is 15 degrees or greater, the efficiency is kept the same.

Figure 5:
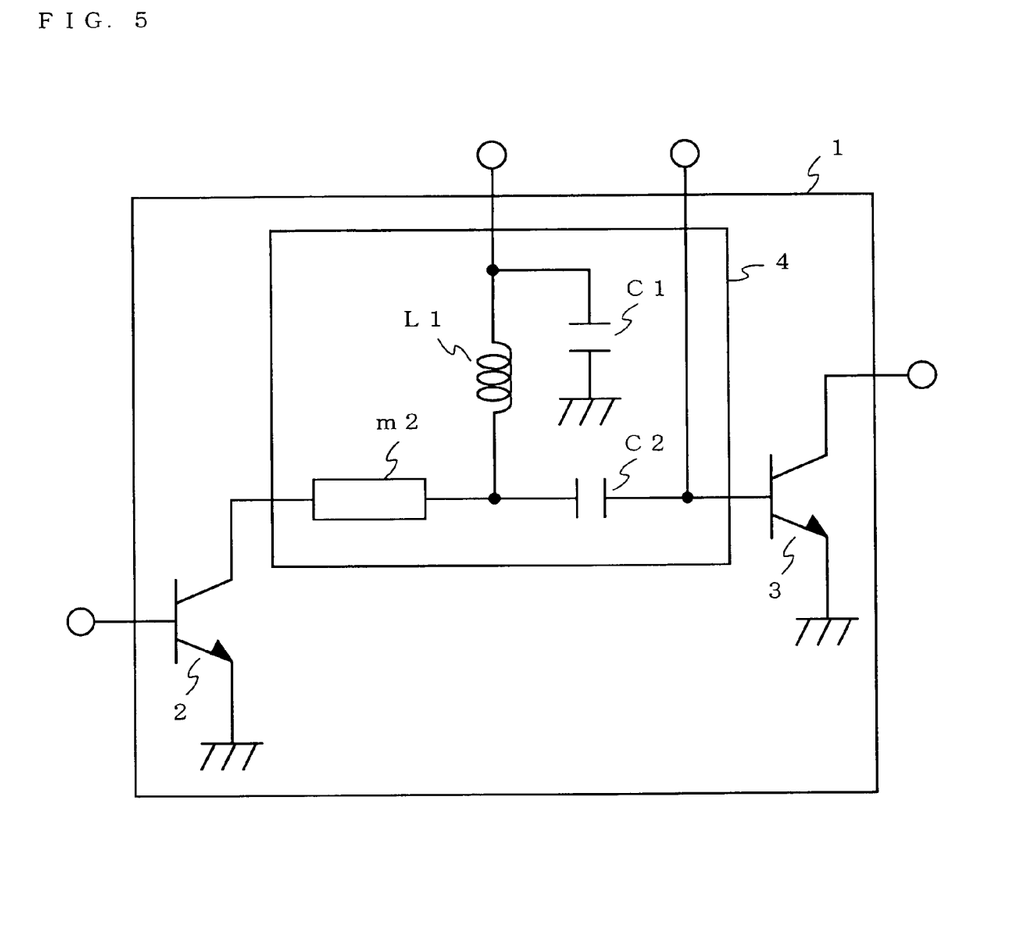
FIG. 5 through FIG. 8 each show a schematic configuration of a radio frequency power amplifier according to another embodiments of the present invention.
Figure 6:
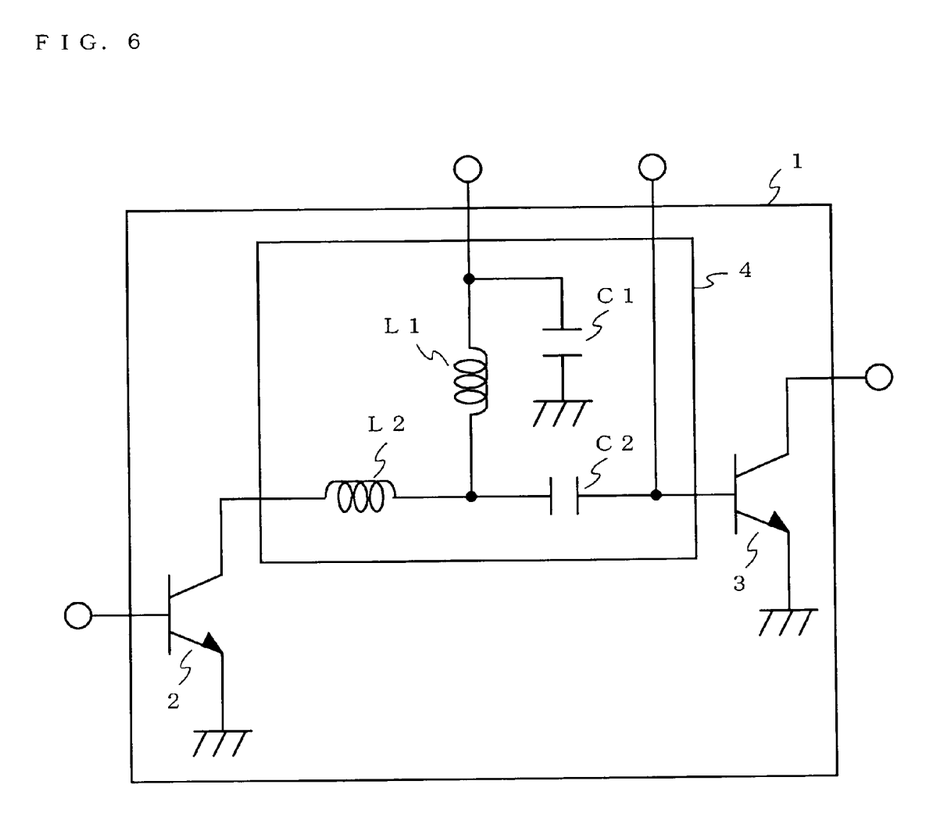
Figure 7:
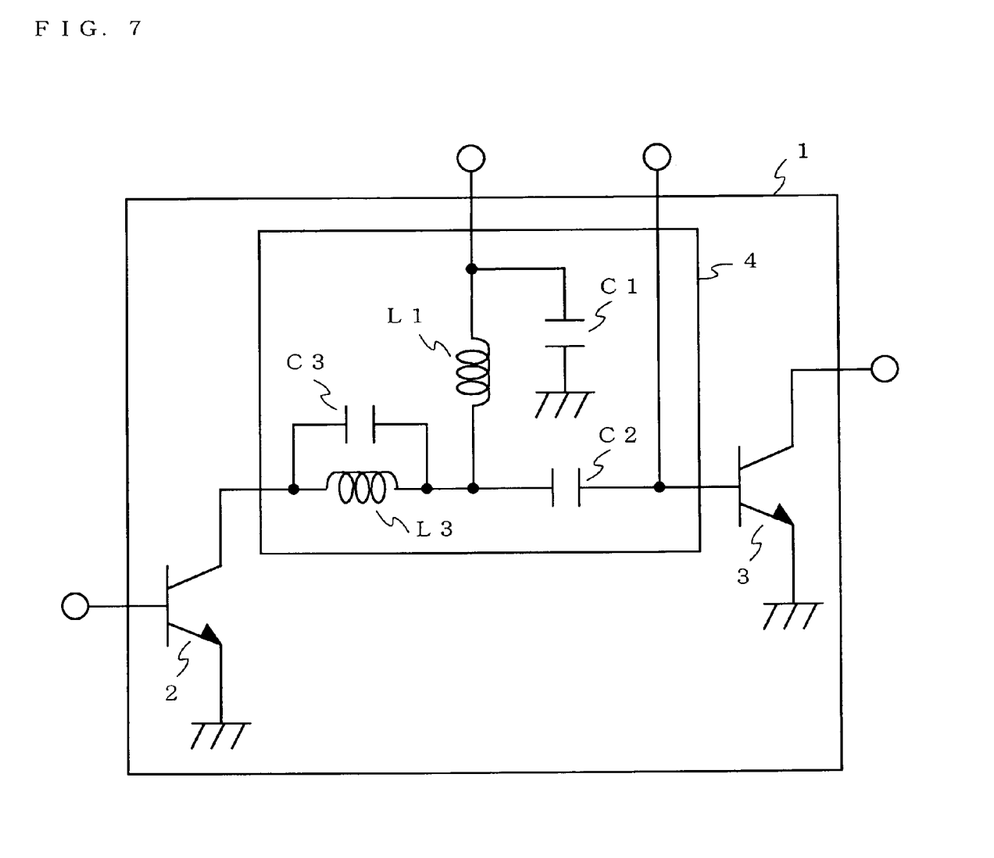

The configurations shown in FIG. 5 through FIG. 7 are usable as other exemplary configurations of the inter-stage matching circuit 4.

In FIG. 5, the transmission line m1 of the inter-stage matching circuit 4 is replaced with an inductor L1. In FIG. 6, the transmission lines m1 and m2 of the inter-stage matching circuit 4 are respectively replaced with inductors L1 and L2. In FIG. 7, the transmission line m1 of the inter-stage matching circuit 4 is replaced with an inductor L1 and the transmission line m2 is replaced with a parallel circuit of an inductor L3 and a capacitor C3. Using any of these configurations, effects equivalent to those of the configuration of FIG. 1 are provided.

Figure 8:
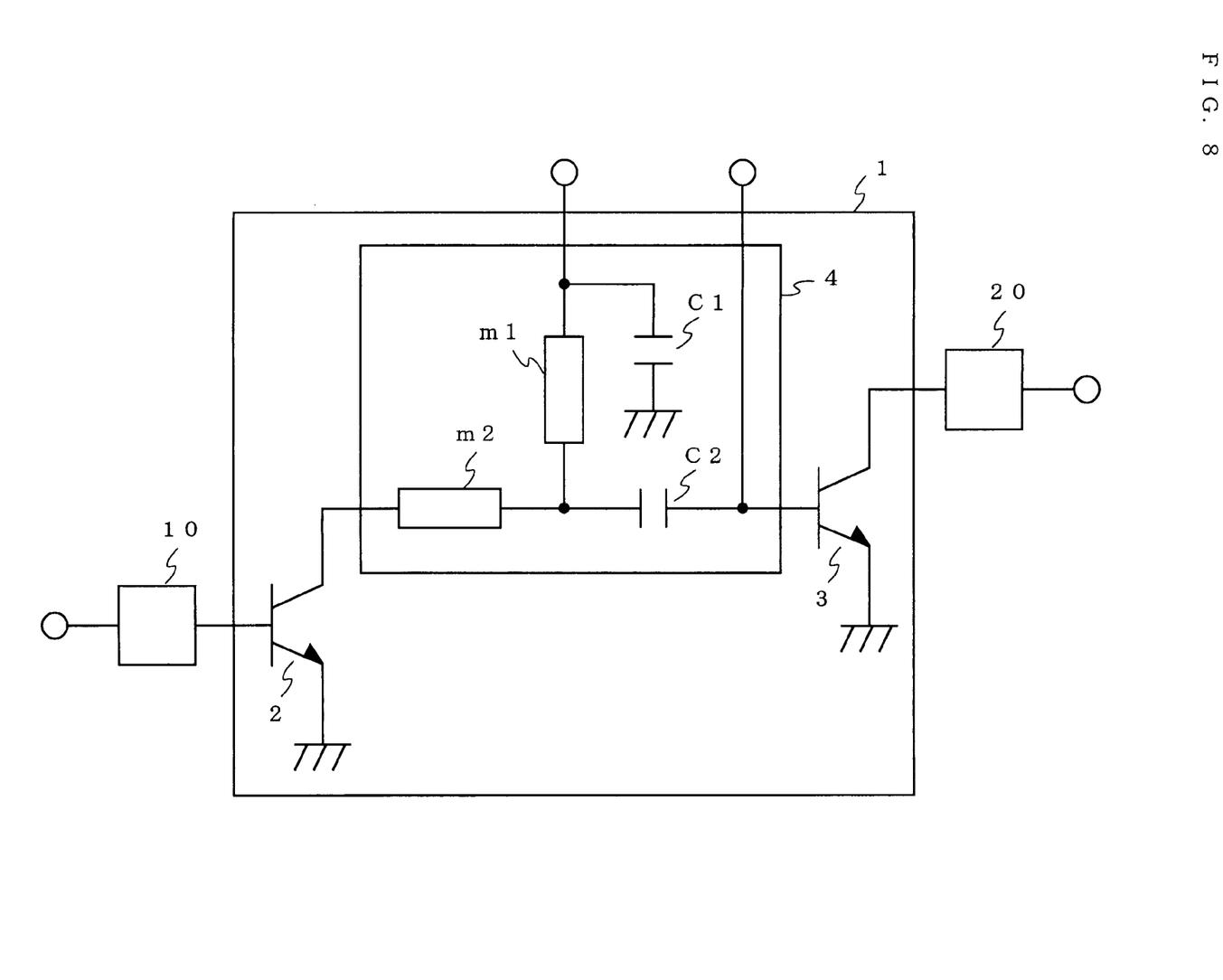

As shown in FIG. 8, an input circuit 10 may be provided at the base of the former-stage transistor 2, and an output circuit 20 may be provided at the collector of the latter-stage transistor 3. The input circuit 10 may be a radio frequency power amplifier including at least one stage of transistor.

The radio frequency power amplifiers 1 shown in the figures are exemplary, and do not limit the present invention. As described above, substantially the same effects are offered by providing an impedance conversion device with which the phase shift of the second harmonic signal is 15 degrees or greater at any position in the inter-stage matching circuit 4.

While the invention has been described in detail, the foregoing description is in all aspects illustrative and not restrictive. It is understood that numerous other modifications and variations can be devised without departing from the scope of the invention.

What is claimed is:

1. A radio frequency power amplifier including transistors for performing non-linear amplification connected in a plurality of stages, the radio frequency power amplifier comprising:
   a former-stage transistor including a base to which a signal is input;
   a latter-stage transistor including a collector from which the signal is output; and
   an inter-stage matching circuit for connecting a collector of the former-stage transistor and a base of the latter-stage transistor;
   wherein the inter-stage matching circuit includes:
      a high-pass filter circuit; and
      an impedance conversion device having an inductor and a capacitor connected in parallel, and
   wherein the impedance conversion device increases a phase shift of a second harmonic signal.

* * * * *